(12) United States Patent
Kim et al.

(10) Patent No.: US 7,719,455 B2
(45) Date of Patent: May 18, 2010

(54) DYNAMIC ELEMENT-MATCHING METHOD, MULTI-BIT DAC USING THE METHOD, AND DELTA-SIGMA MODULATOR AND DELTA-SIGMA DAC INCLUDING THE MULTI-BIT DAC

(75) Inventors: Yi Gyeong Kim, Daejeon (KR); Min Hyung Cho, Daejeon (KR); Chong Ki Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 15 days.

(21) Appl. No.: 12/195,232

(22) Filed: Aug. 20, 2008

(65) Prior Publication Data

US 2009/0121909 A1 May 14, 2009

(30) Foreign Application Priority Data

Nov. 8, 2007 (KR) ...................... 10-2007-0113966

(51) Int. Cl.
*H03M 1/66* (2006.01)
(52) U.S. Cl. ........................ 341/144; 341/118; 341/143
(58) Field of Classification Search .......... 341/143–144
See application file for complete search history.

(56) References Cited

U.S. PATENT DOCUMENTS

| 5,990,819 | A | 11/1999 | Fujimori | |
|---|---|---|---|---|
| 6,348,884 | B1 | 2/2002 | Steensgaard-Madsen | |
| 6,522,277 | B2 * | 2/2003 | Fujimori et al. | ............. 341/144 |
| 6,535,155 | B2 * | 3/2003 | Ruha et al. | ................... 341/144 |
| 7,324,032 | B2 * | 1/2008 | Kim | .......................... 341/144 |
| 7,463,175 | B2 * | 12/2008 | Kim | .......................... 341/126 |

FOREIGN PATENT DOCUMENTS

| KR | 1020040011558 A | 2/2004 |
|---|---|---|
| KR | 1020070021851 A | 2/2007 |
| KR | 1020080020096 A | 3/2008 |

OTHER PUBLICATIONS

Morteza Vadipour, "Techniques for Preventing Tonal Behavior of Data Weighted Averaging Algorithm in Σ-Δ Modulators", IEEE Transactions on Circuits and Systems-II: Analog and Digital Signal Processing, vol. 47, No. 11, Nov. 2000, pp. 1137-1143.

(Continued)

*Primary Examiner*—Khai M Nguyen (57) ABSTRACT

Provided are a dynamic element-matching method, a multi-bit Digital-to-Analog Converter (DAC), and a delta-sigma modulator with the multi-bit DAC and delta-sigma DAC with the multi-bit DAC. The dynamic element-matching method relates to preventing periodic signal components (in-band tones) from being generated from a delta-sigma modulator of a delta-sigma Analog-to-Digital Converter (ADC) and a multi-bit DAC used in a delta-sigma DAC. Unit elements are selected in a new sequence according to a simple algorithm every time that each of unit elements is selected once, and thus the unit elements are not periodically used. Consequently, it is possible to prevent in-band tones caused by a conventional Data Weighted Averaging (DWA) algorithm.

16 Claims, 8 Drawing Sheets

OTHER PUBLICATIONS

Rex T. Baird et al., "Linearity Enhancement of Multibit ΔΣ A/D and D/A Converters Using Data Weighted Averaging", IEEE Transactions on Circuits and Systems-II: Analog and Digital Signal Processing, vol. 42, No. 12, Dec. 1995, pp. 753-762.

Tai-Haur Kuo et al., "A Wideband CMOS Sigma-Delta Modulator With Incremental Data Weighted Averaging", IEEE Journal Of Solid-State Circuits, vol. 37, No. 1, Jan. 2002, pp. 11-17.

Katelijn Vleugels et al., "A 2.5-V Sigma-Delta Modulator for Broadband Communications Applications", IEEE Journal Of Solid-State Circuits, vol. 36, No. 12, Dec. 2001, pp. 1887-1899.

Yong-In Park et al., "A 16-Bit, 5MHz Multi-Bit Sigma-Delta ADC Using Adaptively Randomized DWA", IEEE 2003 Custom Integrated Circuits Conference, pp. 115-118, no month.

Russ E. Radke et al., "A 14-Bit Current-Mode ΣΔ DAC Based Upon Rotated Data Weighted Averaging", IEEE Journal Of Solid-State Circuits, vol. 35, No. 8, Aug. 2000, pp. 1074-1084.

Ichiro Jufimori et al., "A 90-dB SNR 2.5-MHz Output-Rate ADC Using Cascaded Multibit Delta-Sigma Modulation at 8X Oversampling Ratio", IEEE Journal of Solid-State Circuits, vol. 35, No. 12, Dec. 2000, pp. 1820-1828.

Matthew R. Miller et al., "A Multi-Bit Sigma-Delta ADC for Multi-Mode Receivers", IEEE 2002 Custom Integrated Circuits Conference, pp. 191-194, no month.

* cited by examiner

DYNAMIC ELEMENT-MATCHING METHOD, MULTI-BIT DAC USING THE METHOD, AND DELTA-SIGMA MODULATOR AND DELTA-SIGMA DAC INCLUDING THE MULTI-BIT DAC

CROSS-REFERENCE TO RELATED APPLICATION

This application claims priority to and the benefit of Korean Patent Application No. 2007-113966, filed Nov. 8, 2007, the disclosure of which is incorporated herein by reference in its entirety.

BACKGROUND

1. Field of the Invention

The present invention relates to technology for preventing periodic signal components (in-band tones) from being generated from a delta-sigma modulator of a delta-sigma Analog-to-Digital Converter (ADC) and a multi-bit Digital-to-Analog Converter (DAC) used in a delta-sigma DAC, and more particularly, to a dynamic element-matching method, a multi-bit DAC using the method and a delta-sigma modulator and delta-sigma DAC including the multi-bit DAC.

This work was supported by the IT R&D program of MIC/IITA [2006-S-006-02, Components/Module technology for Ubiquitous Terminals].

2. Discussion of Related Art

At an Input/Output (I/O) end or transceiver end of a specific application operating at low frequency and requiring high resolution, signal conversion is performed using a delta-sigma ADC and a delta-sigma DAC.

Figure 1A:
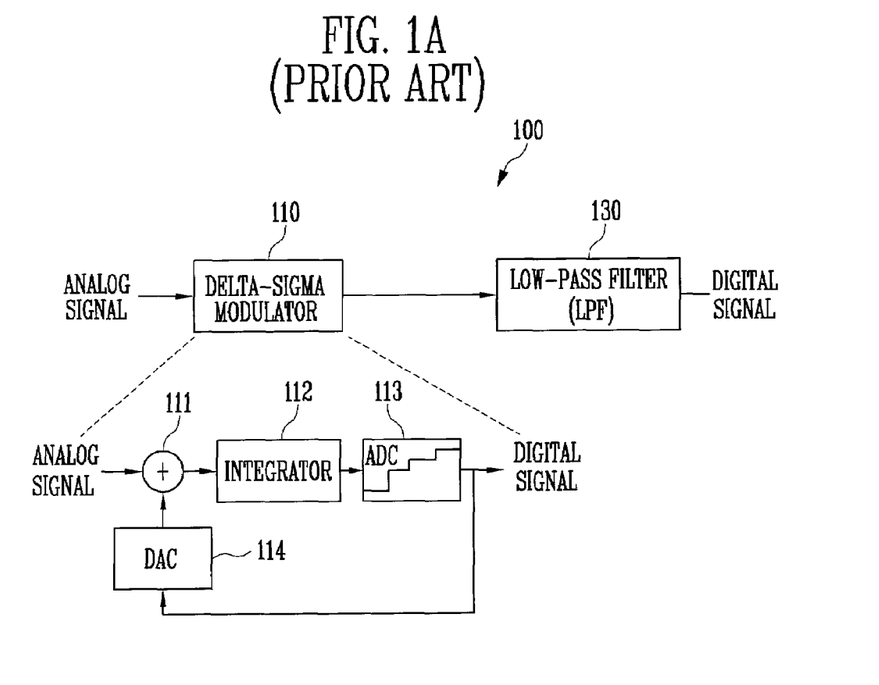
FIGS. 1A and 1B are block diagrams of a conventional delta-sigma Analog-to-Digital Converter (ADC) and a conventional delta-sigma Digital-to-Analog Converter (DAC), and FIG. 1C schematically illustrates a structure of a conventional multi-bit DAC.
Figure 1B:
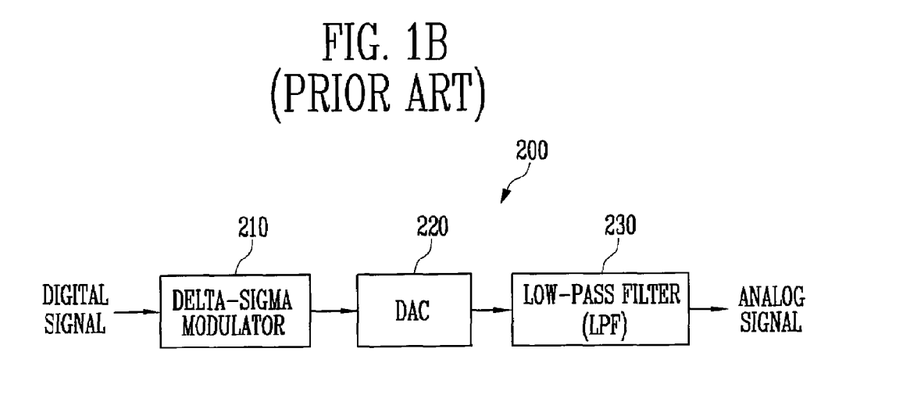
Figure 1C:
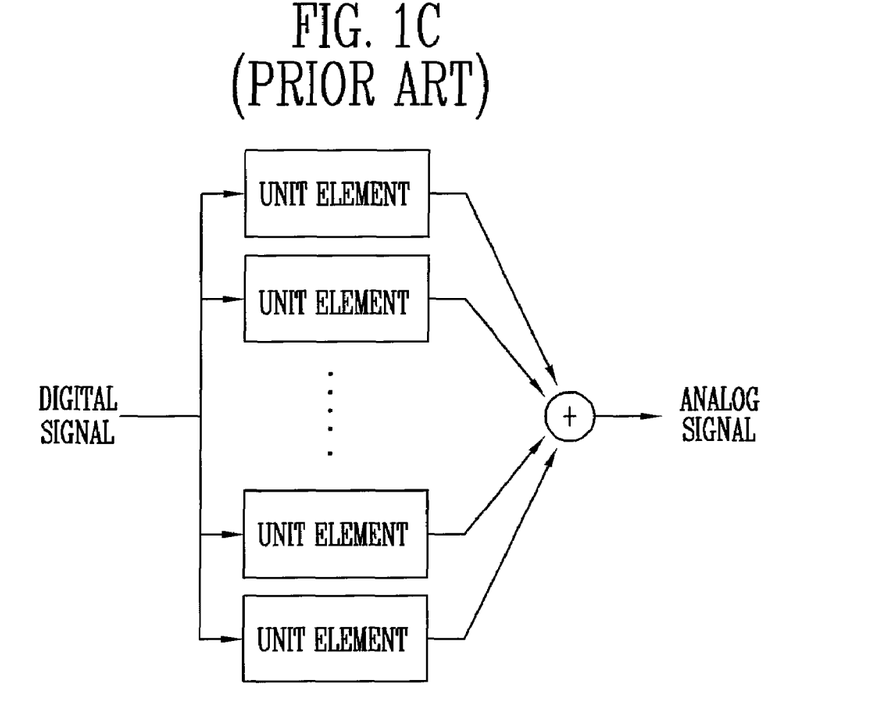

FIGS. 1A and 1B are block diagrams of a conventional delta-sigma ADC 100 and a conventional delta-sigma DAC 200, respectively. FIG. 1C schematically illustrates a structure of a conventional multi-bit DAC.

Referring to FIG. 1A, the delta-sigma ADC 100 comprises a delta-sigma modulator 110 and a Low-Pass Filter (LPF) 130. The delta-sigma modulator 110 comprises an adder 111, an integrator 112, an ADC 113 and a DAC 114. In a multi-bit configuration, the ADC 113 and the DAC 114 are configured for multiple bits.

Referring to FIG. 1B, the delta-sigma DAC 200 comprises a delta-sigma modulator 210, a DAC 220 and an LPF 230. In a multi-bit configuration, the delta-sigma modulator 210 and the DAC 220 are configured for multiple bits.

When the DAC 114 shown in FIG. 1A and the DAC 220 shown in FIG. 1B are configured for multiple bits, respective bits of a digital input code switch analog unit elements, for example, capacitors corresponding thereto and are converted into analog signals, and the analog signals are added together and output, as illustrated in FIG. 1C. In this structure, the non-linear characteristic of digital-analog conversion is caused by a mismatch between unit elements.

To solve the problem of a mismatch between unit elements, research has been actively conducted on Dynamic Element Matching (DEM) such as random averaging, Clocked Averaging (CLA), Individual Level Averaging (ILA), Data Weighted Averaging (DWA), and so on. For example, use of a dynamic element-matching technique has been disclosed in U.S. Pat. No. 5,990,819 "D/A converter and Delta-Sigma D/A converter", and so on.

Using the dynamic element-matching technique, it is possible to select unit elements in random sequence with every operation of a DAC and convert a mismatch between elements into white noise.

In particular, when a rotation algorithm such as a DWA technique, which selects unit elements for an input digital code, is used, mismatches between unit elements are averaged, such that noise caused by an element mismatch can be shaped within a signal band.

The basic technology of the DWA has been disclosed in a periodical "Rex T. Baird, Terry S. Fiez, Linearity Enhancement of Multibit ΔΣA/D and D/A Converters Using Data Weighted Averaging, IEEE Transaction on Circuits and Systems-II: Analog and Digital Signal Processing, Vol. 42, No. 12, December 1995", and so on.

According to a conventional DWA algorithm, unit elements are selected for an input digital signal in sequence or in a simply changed sequence. Therefore, when a specific signal is repeatedly input, periodical signal components, i.e., in-band tones, are generated.

Figure 2:
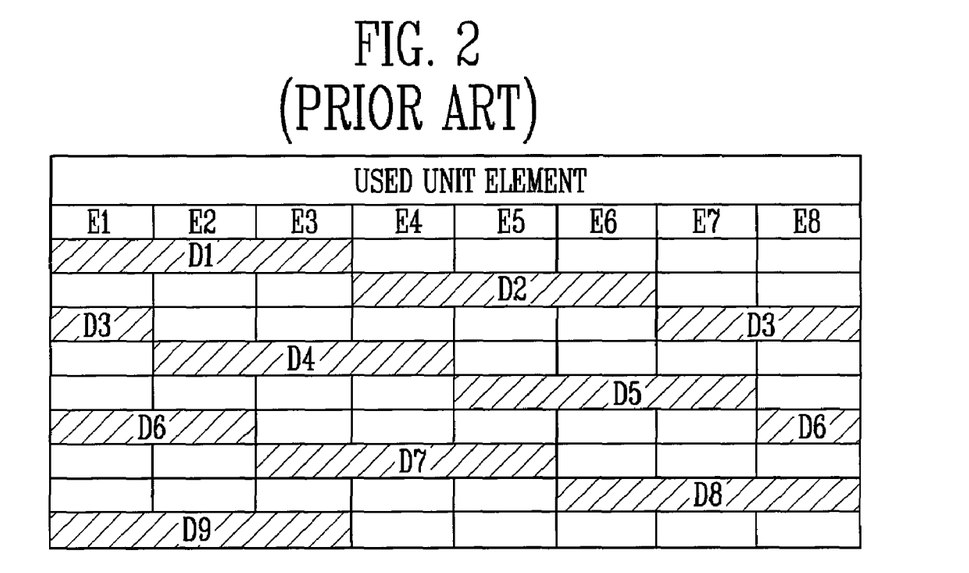
FIG. 2 illustrates a method of selecting a unit element according to a conventional Data Weighted Averaging (DWA) algorithm and a mismatch error according to the method.

FIG. 2 illustrates a method of selecting a unit element according to the conventional DWA algorithm and a mismatch error according to the method. In FIG. 2, the mismatch error is when a 3-bit input signal is applied to 8 unit elements.

As illustrated in FIG. 2, according to the conventional DWA algorithm, the same unit element is selected again for a ninth digital input signal, and thus a DAC mismatch error is repeated every eight cycles. Due to the periodicity of unit element use, a tone is generated at a specific input frequency.

The generation of tones is not preferred because the tones reduce a dynamic range, modulate nose outside a preferable signal band, and interfere with signals within the preferable signal band. Even when the tones exist below the minimum noise, they can be heard in an audio converter. In particular, the problem of the tones becomes prominent as the amount of input digital data decreases.

Therefore, modified DWA techniques for reducing tone generation are being widely researched, and as a result of the research, techniques, such as bi-directional DWA, rotated DWA and incremental DWA, have been proposed in the art. However, the techniques have a problem in that a signal-to-noise ratio increases due to an increase in noise within a signal band, or tones are still generated.

SUMMARY OF THE INVENTION

The present invention is directed to solving a problem of an in-band tone generated by repeatedly selecting a unit element in a delta-sigma modulator of a delta-sigma Analog-to-Digital Converter (ADC) and a multi-bit Digital-to-Analog Converter (DAC) used in a delta-sigma DAC.

One aspect of the present invention provides a dynamic element-matching method, including: selecting at least one of a plurality of unit elements for converting digital data into an analog signal; and reselecting at least one of the unit elements in a new sequence every time that each of the unit elements is selected once.

Another aspect of the present invention provides a multi-bit DAC, including: a plurality of unit elements for converting digital data into an analog signal; a first dynamic element-matching unit for selecting at least one of the unit elements according to digital data; a second dynamic element-matching unit for reselecting at least one of the unit elements in a new sequence every time that each of the unit elements is selected once; and an adder for adding analog signals output from the unit elements to output an added signal.

Still another aspect of the present invention provides a delta-sigma modulator in which an adder, an integrator, a multi-bit ADC and a multi-bit DAC are included, the multi-bit DAC including: a plurality of unit elements for converting digital data into an analog signal; a first dynamic element-matching unit for selecting at least one of the unit elements according to digital data; a second dynamic element-matching unit for selecting at least one of the unit elements in a new sequence every time that each of the unit elements is selected once; and an adder for adding analog signals output from the unit elements to output an added signal.

Yet another aspect of the present invention provides a delta-sigma DAC, in which a delta-sigma modulator, a multi-bit DAC and a low-pass filter are included, the multi-bit DAC including: a plurality of unit elements for converting digital data into an analog signal; a first dynamic element-matching unit for selecting at least one of the unit elements according to digital data; a second dynamic element-matching unit for selecting at least one of the unit elements in a new sequence every time that each of the unit elements is selected; and an adder for adding analog signals output from the unit elements to output an added signal.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

In this specification, the term "unit element" denotes a circuit element capable of converting digital data into an analog signal, that is, in the form of current, charge or voltage. For example, in a switched capacitor Digital-to-Analog Converter (DAC), the unit element may be a capacitor, a current cell, a resistor array, and so on.

Figure 3:
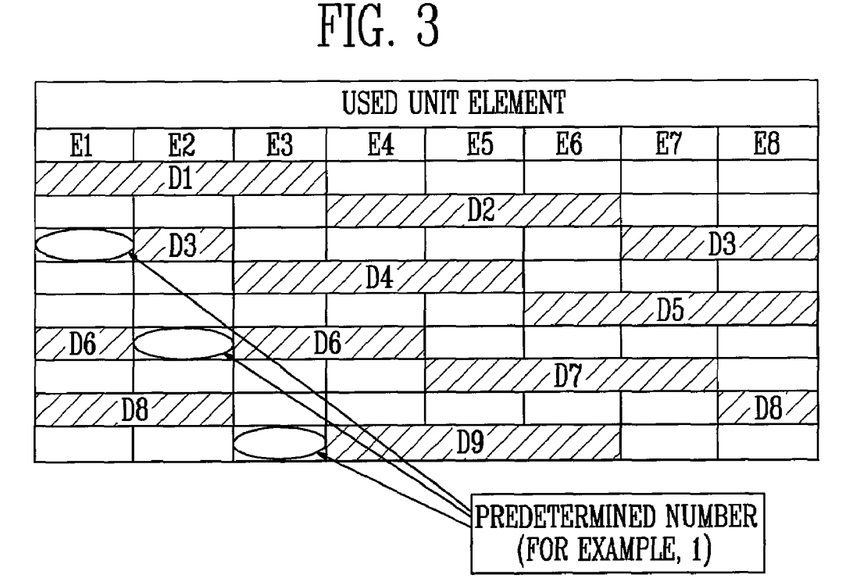
FIG. 3 illustrates a basic concept of a dynamic element-matching method according to an exemplary embodiment of the present invention.

FIG. 3 illustrates a basic concept of a dynamic element-matching method according to an exemplary embodiment of the present invention. In FIG. 3, three unit elements are selected from among eight unit elements according to input 3-bit digital data.

Here, the unit elements are recursively disposed according to a recursive algorithm. That is, a first unit element neighbors an eighth element.

As illustrated in FIG. 3, when all the eight unit elements are used, unit elements are selected in a new sequence according to a dynamic element-matching method of the present invention.

For example, when first digital data D1 is input, three unit elements from a first unit element E1 to its right side are selected. In other words, first to third unit elements E1, E2 and E3 are selected.

Subsequently, when second digital data D2 is input, unit element selection starts from a fourth unit element E4 because the third unit element E3 has been last selected. Thus, fourth to sixth unit elements E4, E5 and E6 are selected.

Next, when third digital data D3 is input, seventh and eighth unit elements L7 and L8 and also the first unit element E1 neighboring the eighth unit element E8 would be selected in turn. However, since each of the unit elements is selected once in a circular way, the seventh and eighth unit elements E7 and E8 and the second unit element E2 shifted from the first unit element E1 by random number are selected. In this example, the random number is 1.

In the same way, when sixth digital data D6 is input, though the first to third unit elements E1, E2 and E3 would be selected in turn, since each of the unit elements is selected once again in a circular way, the first unit element E1 and the third and fourth unit elements E3 and E4 shifted from the second unit element E2 by random number, in this example, random number is 1.

In this exemplary embodiment, it is assumed for convenience that the first unit element E1 is set as a rotation starting point for determining if each of the unit elements is selected once in a circular way, and a unit element selection result is shifted to the right by random number, in this example, random number is 1 when each of the unit elements is selected once in a circular way. However, the rotation starting point, the direction in which unit elements are selected, and the number of shifted unit elements may be changed by those skilled in the art.

Figure 4:
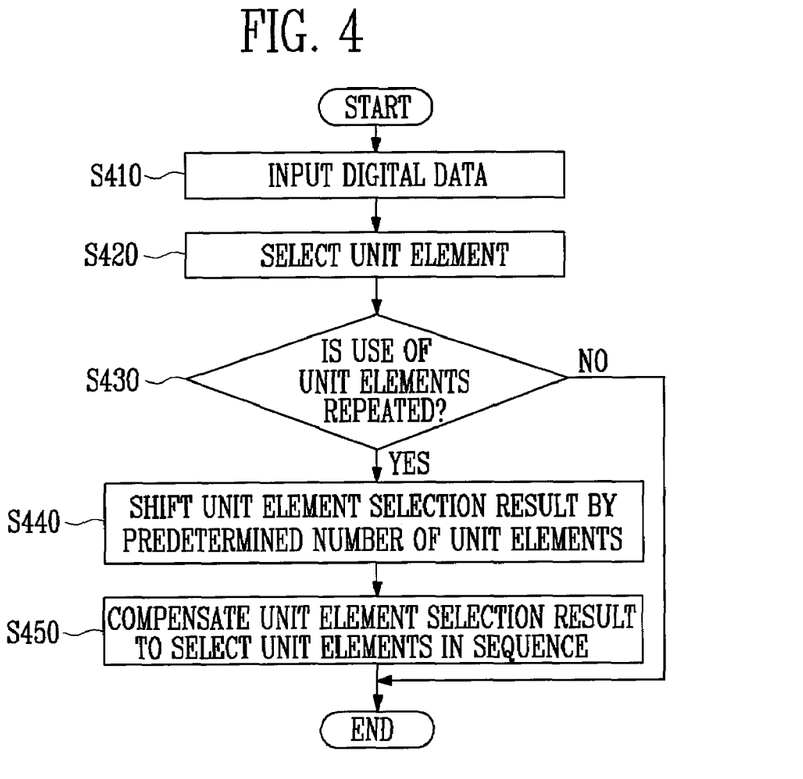
FIG. 4 is a flowchart showing a dynamic element-matching method according to an exemplary embodiment of the present invention.

FIG. 4 is a flowchart showing a dynamic element-matching method according to an exemplary embodiment of the present invention.

Referring to FIG. 4, when digital data is input (step 410), unit elements are selected according to the input digital data (step 420).

Subsequently, it is determined whether each of the unit elements is selected once in a circular way (step 430).

When it is determined that each of the unit elements is selected once in a circular way, the unit element selection result obtained in step 420 is shifted by a predetermined number of unit elements (step 440).

Subsequently, the unit element selection result obtained in step 440 is compensated so that the unit elements can be selected in sequence (step 450).

When it is determined in step 430 that all of the unit elements are not used, the unit element selection result obtained in step 420 is used as is.

In other words, the dynamic element-matching method according to an exemplary embodiment of the present invention selects unit elements in a new sequence every time that each of the unit elements is selected once in a circular way. Therefore, the unit elements are not periodically used, and thus it is possible to prevent a tone caused by conventional Data Weighted Averaging (DWA). In addition, it is possible to maintain DWA characteristic of averaging mismatches caused by an element mismatch within a signal band.

Figure 5:
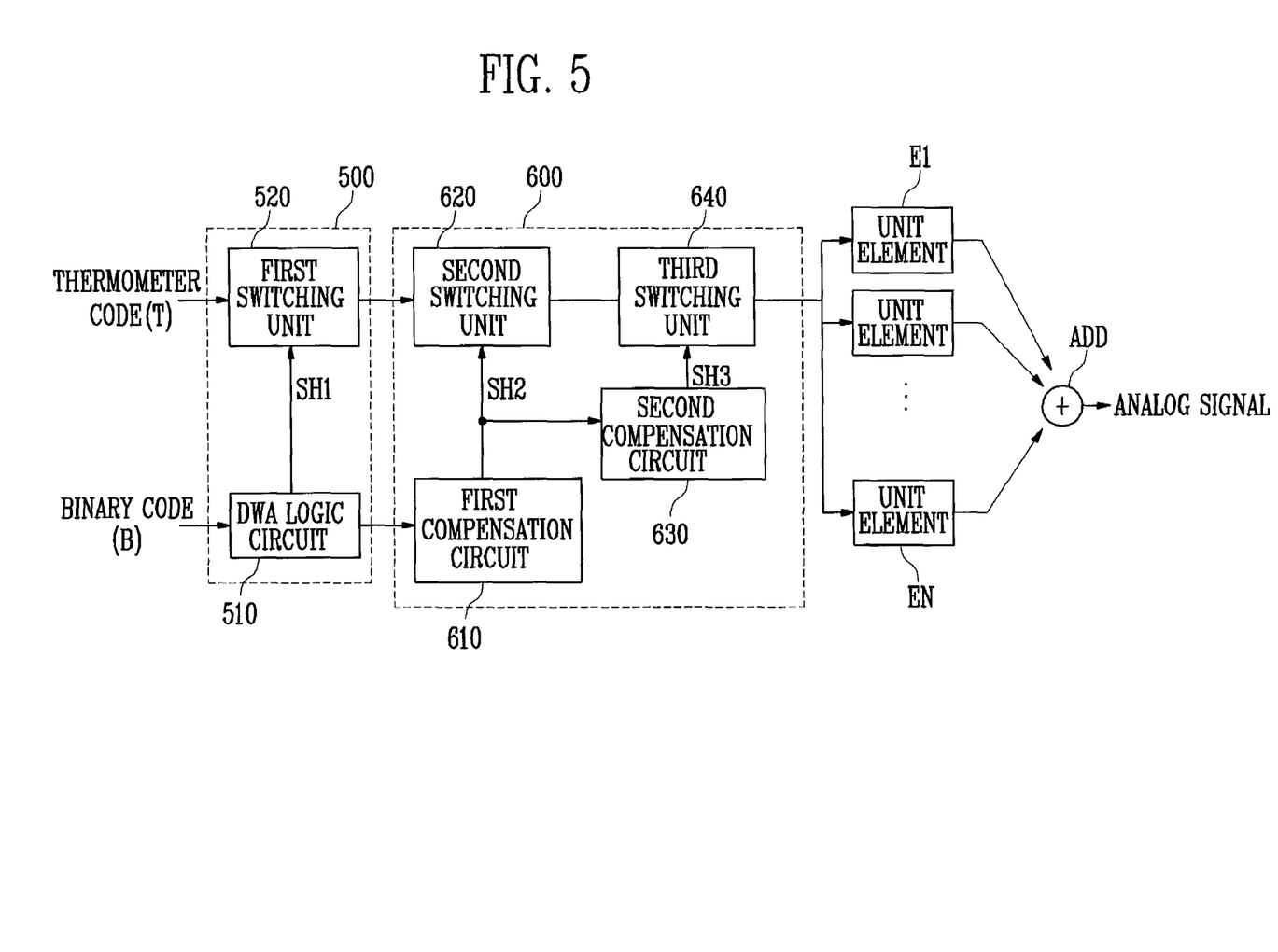
FIG. 5 is a block diagram of a multi-bit DAC employing a dynamic element-matching method according to an exemplary embodiment of the present invention.

FIG. 5 is a block diagram of a multi-bit DAC employing a dynamic element-matching method according to an exemplary embodiment of the present invention.

Referring to FIG. 5, the multi-bit DAC according to an exemplary embodiment of the present invention comprises a plurality of unit elements E1, . . . , and EN for converting a digital signal into an analog signal, a first dynamic element-matching unit 500 for selecting at least one of the unit elements according to digital data input from outside, a second dynamic element-matching unit 600 for selecting at least one of the unit elements in a new sequence every time that each of the unit elements is used, and an adder ADD for adding analog signals output from the unit elements E1, . . . , and EN and outputting an added signal.

The multi-bit DAC described above may be used as a multi-bit DAC (see FIG. 1A) of a delta-sigma modulator of a multi-bit delta-sigma ADC or a multi-bit DAC (see FIG. 1B) of a multi-bit delta-sigma DAC. Detailed constitution and operation of the multi-bit DAC will be described below.

First, when a thermometer code T and a binary code B corresponding to the thermometer code T that are digital data are input, a DWA logic circuit 510 of the first dynamic element-matching unit 500 outputs a first shift value SH1 by circulating the binary code B according to a DWA algorithm, and a first switching unit 520 shifts the thermometer code T according to the first shift value SH1 and selects some of the unit elements E1, . . . , and EN.

After this, a first compensation circuit 610 of the second dynamic element-matching unit 600 outputs a second shift value SH2 for compensating the unit element selection result of the first switching unit 520 every time that each of the unit elements are used once. Thus, the second switching unit 620 receives the unit element selection result from the first dynamic element-matching unit 500, shifts the result according to the second shift value SH2, and outputs the shifted result.

In other words, the second shift value SH2 is a compensation value for selecting a unit element in a new sequence every time that each of the unit elements is used once. Since the unit element selection result is shifted by the second shift value SH2, the unit elements are not periodically used.

Subsequently, a second compensation circuit 630 of the second dynamic element-matching unit 600 receives the second shift value SH2 from the first compensation circuit 610, and outputs a third shift value SH3 for selecting the unit elements in sequence. Thus, the third switching unit 640 receives the unit element selection result from the second switching unit 620, shifts the result according to the third shift value SH3, and outputs a final unit element selection result.

When a unit element is finally selected through this process, the selected unit element converts a digital signal into an analog signal and outputs the analog signal.

In other words, the multi-bit DAC according to an exemplary embodiment of the present invention selects a unit element in a new sequence every time that each of unit elements is used once. Therefore, the unit elements are not periodically used, and thus it is possible to prevent a tone caused by the conventional DWA algorithm.

Figure 6:
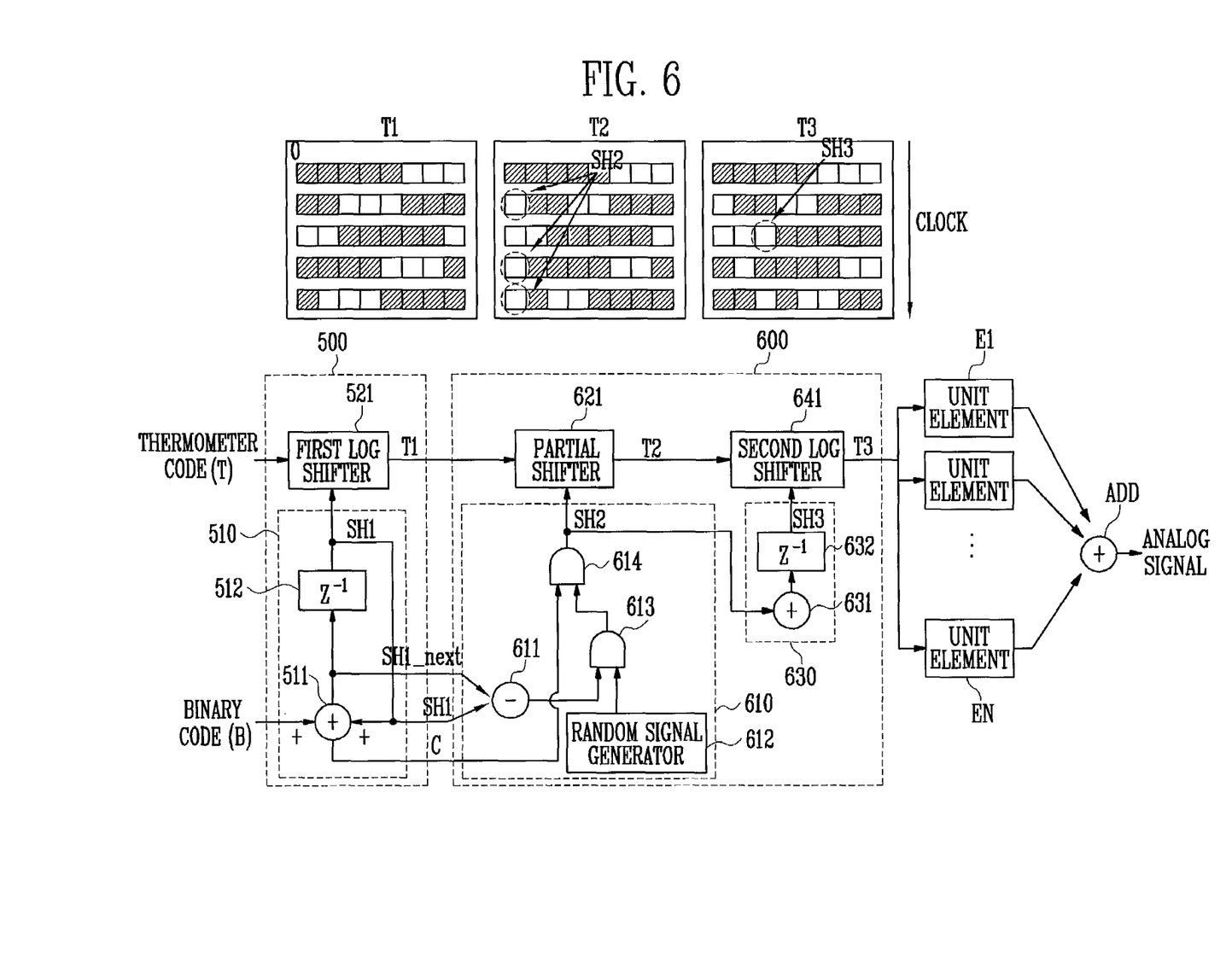
FIG. 6 is a circuit diagram of an actually implemented multi-bit DAC shown in FIG. 5.

FIG. 6 is a circuit diagram of an actually implemented multi-bit DAC shown in FIG. 5.

This exemplary embodiment describes a process of selecting five unit elements from among eight unit elements according to an input thermometer code T. Here, the unit elements are recursively disposed according to a recursive algorithm. That is, a first unit element neighbors an eighth element.

Referring to FIG. 6, a first log shifter 521, a partial shifter 621 and a second log shifter 641 correspond to the first switching unit 520, the second switching unit 620 and the third switching unit 640, respectively.

The DWA logic circuit 510 of the first dynamic element-matching unit 500 comprises a first adder 511 and a first delayer 512, and the first compensation circuit 610 of the second dynamic element-matching unit 600 comprises a subtractor 611, a random signal generator 612 and first and second AND gates 613 and 614. The second compensation circuit 630 comprises a second adder 631 and a second delayer 632.

In this exemplary embodiment, the first compensation circuit 610 comprises the subtractor 611, the random signal generator 612 and the first and second AND gates 613 and 614. However, this is only an exemplary embodiment, and can be modified in various ways by those skilled in the art.

First, when a thermometer code T and a binary code B corresponding to the thermometer code T are input to the first dynamic element-matching unit 500, the first dynamic element-matching unit 500 shifts the thermometer code T by a first shift value SH1 and outputs a first selection value T1. Here, the first shift value SH1 is obtained from the binary code B according to the DWA algorithm, and the first selection value T1 indicates which unit element is selected.

Here, an SH1 pointer indicating a starting point of a currently-selected unit element, an SH1_next pointer indicating a starting point of a unit element to be next selected, and a carry C generated by adding the SH1 pointer and the SH1_next pointer are input to the first compensation circuit 610 of the second dynamic element-matching unit 600.

Subsequently, the subtractor 611 of the first compensation circuit 610 outputs a difference between the SH1 pointer and the SH1_next pointer to the first AND gate 613, and the first AND gate 613 performs an AND operation on a random signal generated from the random signal generator 612 and the difference between the two pointers input from the subtractor 611 and outputs the operation result to the second AND gate 614. The second AND gate 614 performs the AND operation on the output of the first AND gate 613 and the carry C input from the first dynamic element-matching unit 500 and outputs a second shift value SH2.

In other words, only when each of the unit elements is used once in a circular way and the carry C is generated by adding the SH1 pointer and the SH1_next pointer, that is, the first selection value T1 is end-around, the first compensation circuit 610 outputs the second shift value SH2 within a range in which a code error does not occur.

Here, the second shift value SH2 is a compensation value for selecting a unit element in a new sequence every time that each of the unit elements is used once.

Subsequently, the partial shifter 621 of the second dynamic element-matching unit 600 receives the first selection value T1 from the first log shifter 521, partly shifts the first selected value T1 according to the second shift value SH2 input from the first compensation circuit 610, and outputs a second selection value T2. When the second shift value SH2 is not input from the first compensation circuit 610, the partial shifter 621 outputs the first selection value T1 as is. Therefore, only when each of the unit elements is used once as illustrated in FIG. 6, the second selection value T2 is a value obtained by shifting the first selection value T1 by the second shift value SH2. Here, the second selection value T2 indicates which unit element is selected.

Subsequently, the second log shifter 641 of the second dynamic element-matching unit 600 shifts the second selection value T2 input from the partial shifter 621 by a third shift value SH3 and outputs a third selection value T3. Here, the third shift value SH3 is a compensation value for selecting the unit elements in sequence. The second compensation circuit 630 accumulates the second shift value SH2 using the second adder 631 and the second delayer 632, and outputs the accumulated value as the third shift value SH3. Therefore, as illustrated in FIG. 6, a unit element is repeatedly selected in the second selection value T2, but the unit elements are selected in sequence in the third selection value T3.

In other words, the multi-bit DAC according to an exemplary embodiment of the present invention selects a unit element in a new sequence using the first compensation circuit 610 every time that each of the unit elements is used once in a circular way, and selects the unit elements in sequence using the second compensation circuit 630. Thus, the unit elements are not periodically used, and it is possible to prevent a tone caused by the conventional DWA algorithm.

Figure 7A:
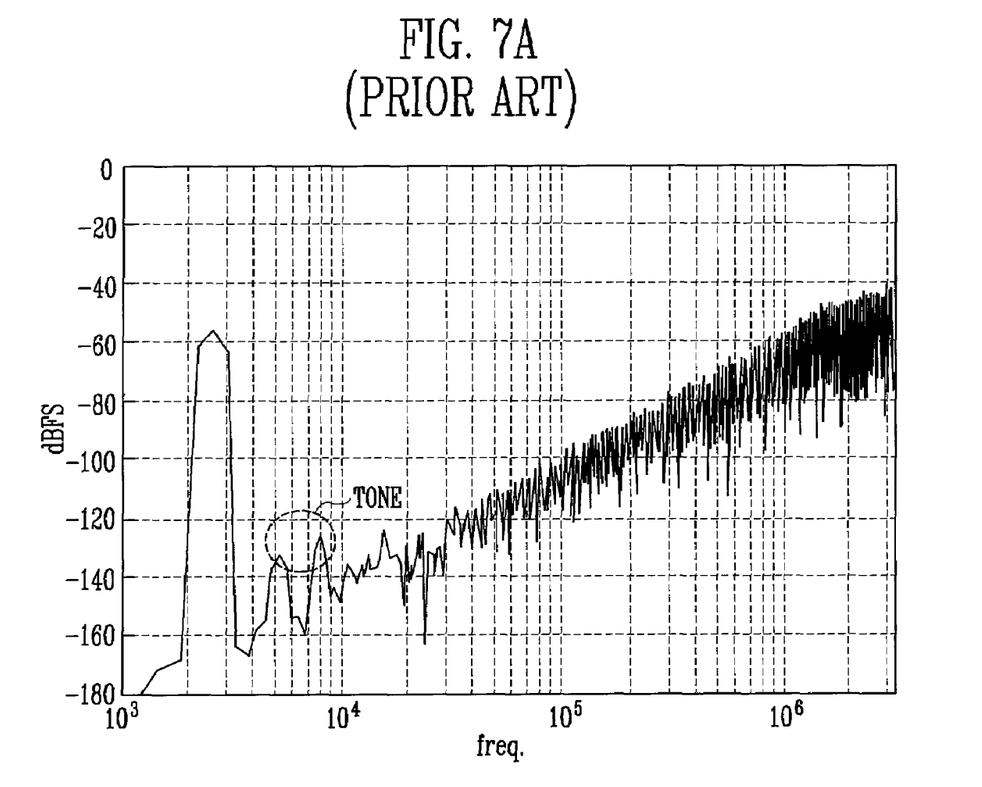
FIG. 7A is a graph showing a Fast Fourier Transform (FFT) simulation result of a delta-sigma modulator employing conventional DWA.
Figure 7B:
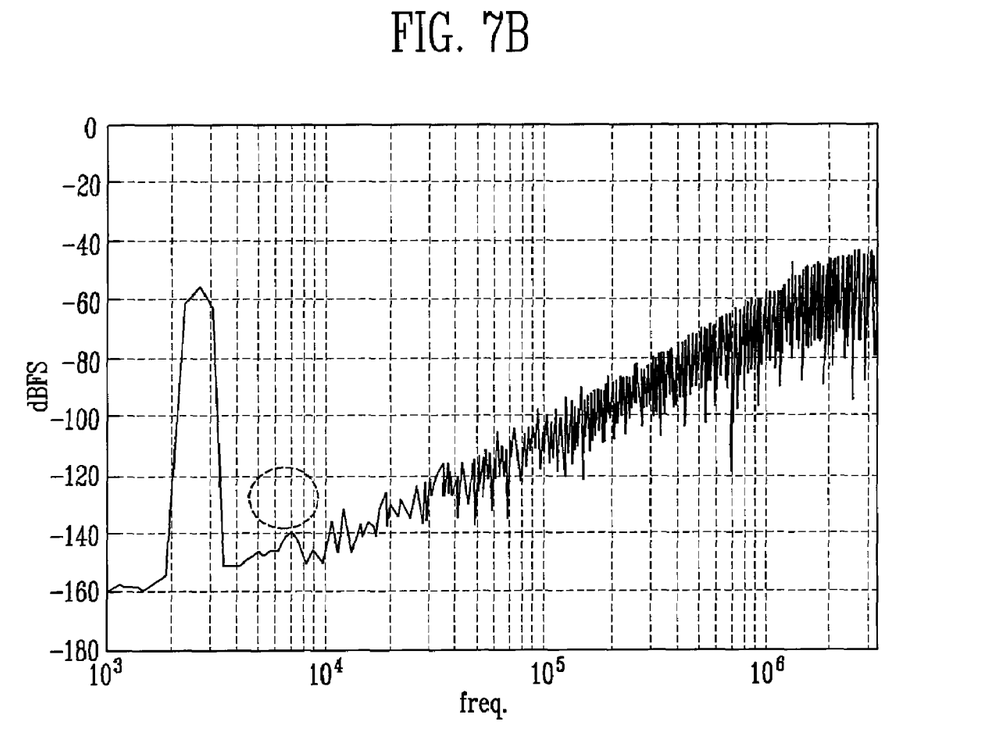
FIG. 7B is a graph showing an FFT simulation result of a delta-sigma modulator employing a dynamic element-matching method according to an exemplary embodiment of the present invention.

FIG. 7A is a graph showing a Fast Fourier Transform (FFT) simulation result of a delta-sigma modulator employing conventional DWA, and FIG. 7B is a graph showing an FFT simulation result of a delta-sigma modulator employing a dynamic element-matching method according to an exemplary embodiment of the present invention. The simulations were performed using a second-order 4-bit delta-sigma modulator, and a DAC unit element mismatch error was set to be maximum 0.5%. With respect to a sampling frequency of 6.144 MHz, an input frequency was set to 2.5 kHz, and the level of an input signal was set to −55 dB.

As can be seen from FIG. 7A, a tone was generated from an output signal of the delta-sigma modulator employing conventional DWA, and thus a dynamic range of the delta-sigma modulator was considerably limited.

On the other hand, as seen from FIG. 7B, no unnecessary tone was generated at all from an output signal of the delta-sigma modulator employing a dynamic element-matching method according to an exemplary embodiment of the present invention.

Figure 8:
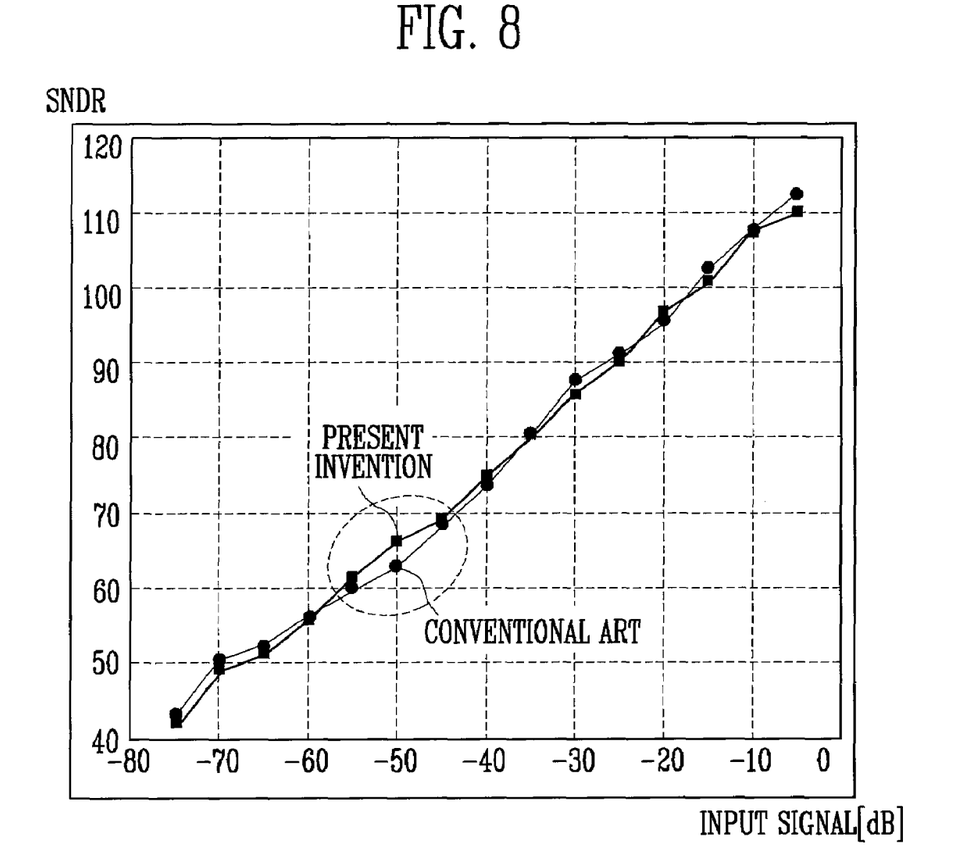
FIG. 8 is a graph showing a high Signal-to-Noise and Distortion Ratio (SNDR) corresponding to an input signal in a delta-sigma modulator employing a conventional DWA algorithm and a delta-sigma modulator employing a dynamic element-matching method according to an exemplary embodiment of the present invention.

FIG. 8 is a graph showing a Signal-to-Noise and Distortion Ratio (SNDR) corresponding to an input signal amplitude in a delta-sigma modulator employing the conventional DWA algorithm and a delta-sigma modulator employing a dynamic element-matching method according to an exemplary embodiment of the present invention.

As can be seen from FIG. 8, an SNDR deteriorates at a specific input signal, i.e., −50 dB, in the delta-sigma modulator employing the conventional DWA algorithm, but does not deteriorate in the delta-sigma modulator employing the dynamic element-matching method according to an exemplary embodiment of the present invention. In addition, with respect to other input signals, the delta-sigma modulator according to an exemplary embodiment of the present invention has the almost same SNDR as the conventional delta-sigma modulator.

As described above, in a delta-sigma modulator of a delta-sigma ADC and a multi-bit DAC used in a delta-sigma DAC, unit elements are selected in a new sequence according to a simple algorithm every time that use of the unit elements is repeated. Therefore, the unit elements are not periodically used, and thus it is possible to prevent an in-band tone generated according to a conventional DWA algorithm.

In addition, a DWA characteristic of averaging mismatches between unit elements to shape noise caused by a mismatch between unit elements within a signal band, can be maintained as is, and also an SNDR is not deteriorated by a specific input signal.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A dynamic element-matching method, comprising:
    selecting at least one of a plurality of unit elements for converting digital data into an analog signal; and
    reselecting at least one of the unit elements in a new sequence every time that each of the unit elements is selected once,
    wherein the reselecting the at least one of the unit elements in a new sequence includes:
    if each of the unit elements is selected once, shifting the reselection result to the left or right by a predetermined number of unit elements; and
    compensating the shifted reselection result to select the unit elements in sequence.

2. The dynamic element-matching method of claim 1, wherein the reselecting the at least one of the unit elements in a new sequence includes using the reselection result as it is, if all of the unit elements are not yet selected.

3. A multi-bit Digital-to-Analog Converter (DAC), comprising:
    a plurality of unit elements for converting digital data into an analog signal;
    a first dynamic element-matching unit for selecting at least one of the unit elements according to digital data;
    a second dynamic element-matching unit for reselecting at least one of the unit elements in a new sequence every time that each of the unit elements is selected once, wherein the second dynamic element includes at least one compensating circuit for compensating the reselected unit elements to be in sequence; and
    an adder for adding analog signals output from the unit elements to output an added signal.

4. The multi-bit DAC of claim 3, wherein the unit elements are selected from a capacitor, a current cell and a resistor array.

5. The multi-bit DAC of claim 3, wherein the first dynamic element matching unit comprises:
    a Data Weighted Averaging (DWA) logic circuit for outputting a first shift value by circulating a binary code of the digital data using a DWA algorithm; and
    a first switching unit for shifting the digital data according to the first shift value and selecting the at least one of the unit elements.

6. The multi-bit DAC of claim 5, wherein the DWA logic circuit comprises a first adder and a first delayer, and the first switching unit comprises a first log shifter.

7. The multi-bit DAC of claim 3, wherein the second dynamic element-matching unit comprises:
    a first compensation circuit for outputting a second shift value for compensating the unit element selection result obtained by the first dynamic element-matching unit every time that each of the unit elements is selected once;

a second switching unit for receiving the unit element selection result from the first dynamic element-matching unit and shifting the unit element selection result according to the second shift value;

a second compensation circuit for outputting a third shift value for compensating the unit element selection result shifted by the second switching unit; and a third switching unit for receiving the shifted unit element selection result from the second switching unit and shifting it according to the third shift value.

8. The multi-bit DAC of claim 7, wherein the second shift value is a compensation value for selecting a unit element in a new sequence every time that each of the unit elements is selected once.

9. The multi-bit DAC of claim 7, wherein the third shift value is a compensation value for selecting the unit elements in sequence.

10. The multi-bit DAC of claim 7, wherein the second switching unit comprises a partial shifter, and the third switching unit comprises a second log shifter.

11. The multi-bit DAC of claim 7, wherein the first compensation circuit receives a first pointer indicating a staffing point of a currently-selected unit element, a second pointer indicating a staffing point of a unit element to be next selected and a carry generated by adding the first and second points from the first dynamic element-matching unit, and outputs the second shift value to the second switching unit every time that each of the unit elements is selected once.

12. The multi-bit DAC of claim 11, wherein the first compensation circuit comprises:
    a subtractor for calculating a difference between the first and second pointers input from the first dynamic element-matching unit;
    a random signal generator for generating a random signal;
    a first AND gate for performing an AND operation on the random signal generated from the random signal generator and the difference between the first and second pointers input from the subtractor; and
    a second AND gate for performing the AND operation on an output of the first AND gate and the carry input from the first dynamic element matching unit, and outputting the second shift value.

13. The multi-bit DAC of claim 7, wherein the second compensation circuit accumulates the second shift value input from the first compensation circuit and outputs the accumulated value as the third shift value.

14. The multi-bit DAC of claim 13, wherein the second compensation circuit comprises a second adder and a second delayer.

15. A delta-sigma modulator comprising an adder, an integrator, a multi-bit Analog-to-Digital Converter (ADC) and a multi-bit Digital-to-Analog Converter (DAC), the multi-bit DAC comprising:
    a plurality of unit elements for converting digital data into an analog signal;
    a first dynamic element-matching unit for selecting at least one of the unit elements according to digital data;
    a second dynamic element-matching unit for selecting at least one of the unit elements in a new sequence every time that each of the unit elements is selected once, wherein the second dynamic element includes at least one compensating circuit for compensating the unit elements, selected by the second dynamic element-matching unit, to be in sequence; and
    an adder for adding analog signals output from the unit elements to output an added signal.

16. A delta-sigma Digital-to-Analog Converter (DAC), in which a delta-sigma modulator, a multi-bit DAC and a low-pass filter are included, the multi-bit DAC comprising:
    a plurality of unit elements for converting digital data into an analog signal;
    a first dynamic element-matching unit for selecting at least one of the unit elements according to digital data;
    a second dynamic element-matching unit for selecting at least one of the unit elements in a new sequence every time that use of the unit elements is repeated, wherein the second dynamic element includes at least one compensating circuit for compensating the unit elements, selected by the second dynamic element-matching unit, to be in sequence; and
    an adder for adding analog signals output from the unit elements to output an added signal.

* * * * *